(12) United States Patent
Rapp

(10) Patent No.: US 7,679,911 B2
(45) Date of Patent: Mar. 16, 2010

(54) ELECTRONIC PACKAGE WHEREBY AN ELECTRONIC ASSEMBLY IS PACKAGED WITHIN AN ENCLOSURE THAT IS DESIGNED TO ACT AS A HEAT PIPE

(76) Inventor: Robert J Rapp, 23333 Ridge Route, #126, Lake Forest, CA (US) 92630

( * ) Notice: Subject to any disclaimer, the term of this patent is extended or adjusted under 35 U.S.C. 154(b) by 0 days.

(21) Appl. No.: 12/286,211

(22) Filed: Sep. 29, 2008

(65) Prior Publication Data
US 2009/0073657 A1    Mar. 19, 2009

(51) Int. Cl.
*H05K 7/20* (2006.01)
(52) U.S. Cl. ............... 361/700; 361/698; 361/699; 257/714; 257/715; 174/15.1; 174/15.2; 165/80.4; 165/104.26; 165/104.33
(58) Field of Classification Search ............... None
See application file for complete search history.

(56) References Cited
U.S. PATENT DOCUMENTS 5,998,863 A * 12/1999 Kobayashi et al. .......... 257/715
6,237,223 B1 * 5/2001 McCullough .......... 29/890.032
6,793,009 B1 * 9/2004 Sarraf .................... 165/104.33
7,324,341 B2 * 1/2008 Oman ........................ 361/700
7,369,410 B2 * 5/2008 Chen et al. .................. 361/701
2006/0274502 A1 * 12/2006 Rapp .......................... 361/696

* cited by examiner

*Primary Examiner*—Boris L Chervinsky

(57) ABSTRACT

An electronic component or assembly that is assembled within a case that is designed to operate as a liquid phase to gas phase heat pipe where the electronic component or assembly is introduced into a liquid or partially liquid partially gaseous environment; whereby said liquid evaporates into a gas absorbing heat energy and transferring it to and through the component's or assembly's case. The case will be engineered out of materials that do not contaminate the liquid and electronics with ions and will be engineered to include a plurality of chambers/towers that extend in various directions providing enhanced heat pipe functionality in any physical orientation.

4 Claims, 8 Drawing Sheets

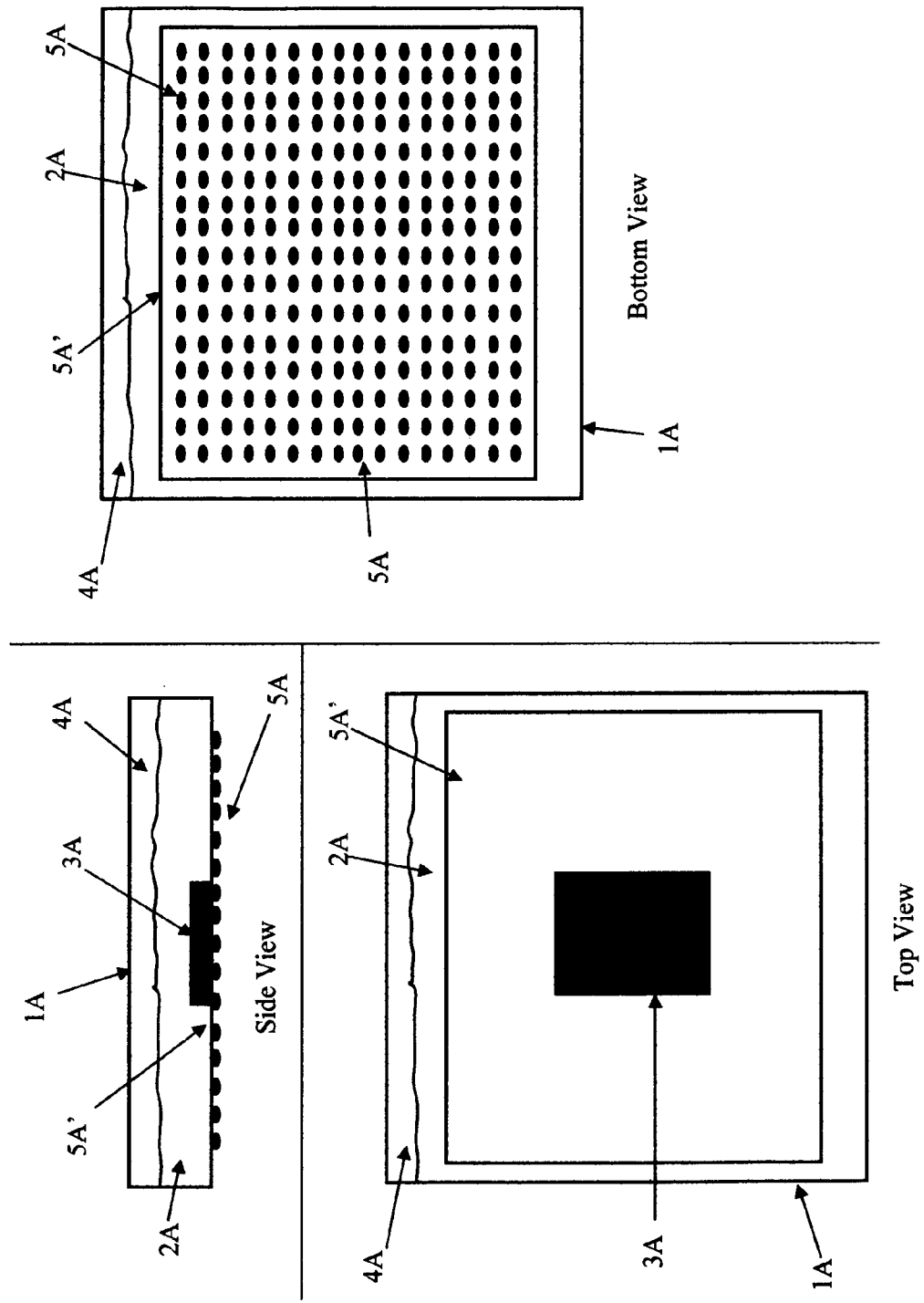
Figure 1: An Electronic Assembly Packaged in a Case that is Designed to Operate as a Liquid Phase to Gas Phase Heat Pipe in a tower-less case:

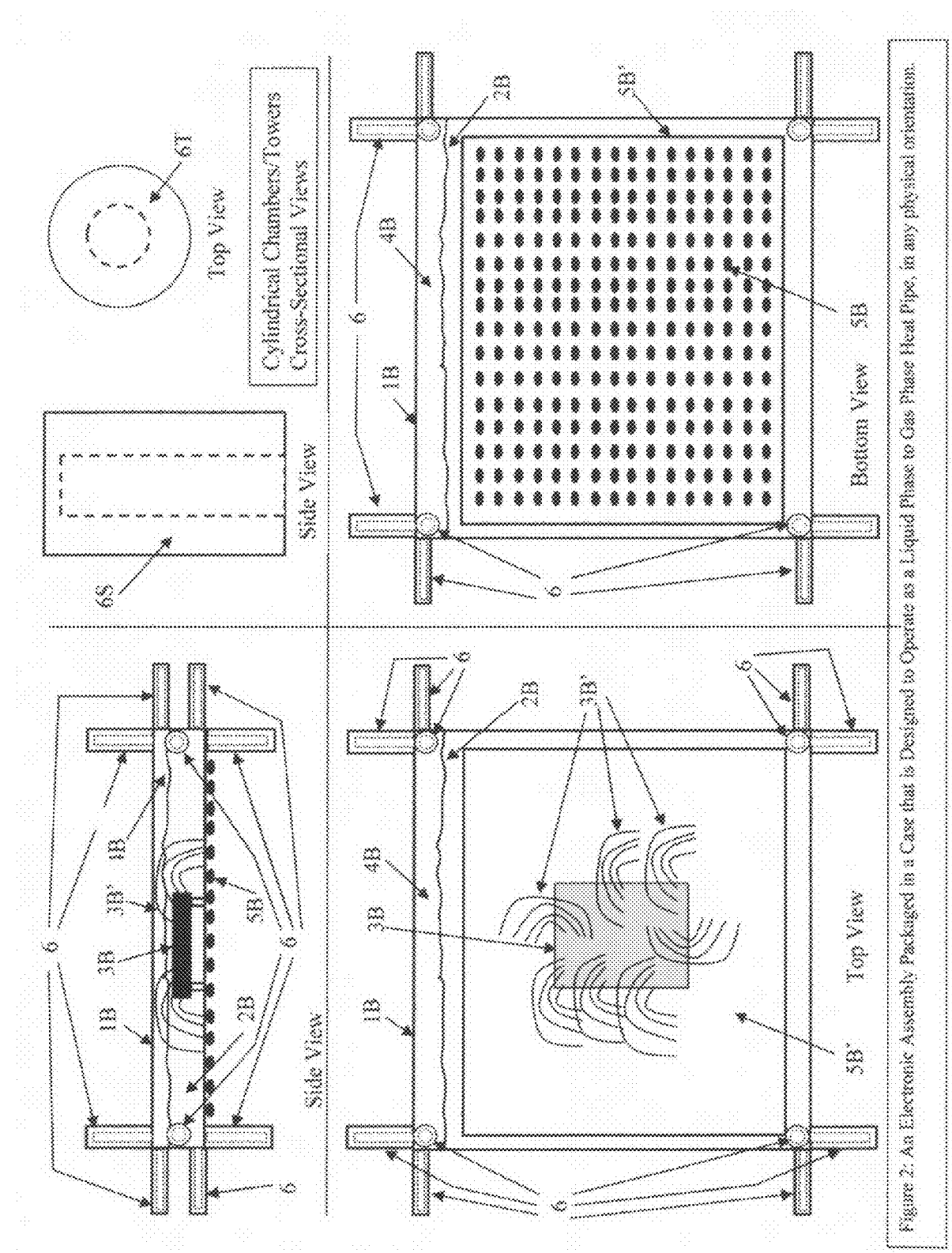
Figure 2. An Electronic Assembly Packaged in a Case that is Designed to Operate as a Liquid Phase to Gas Phase Heat Pipe, in any physical orientation.

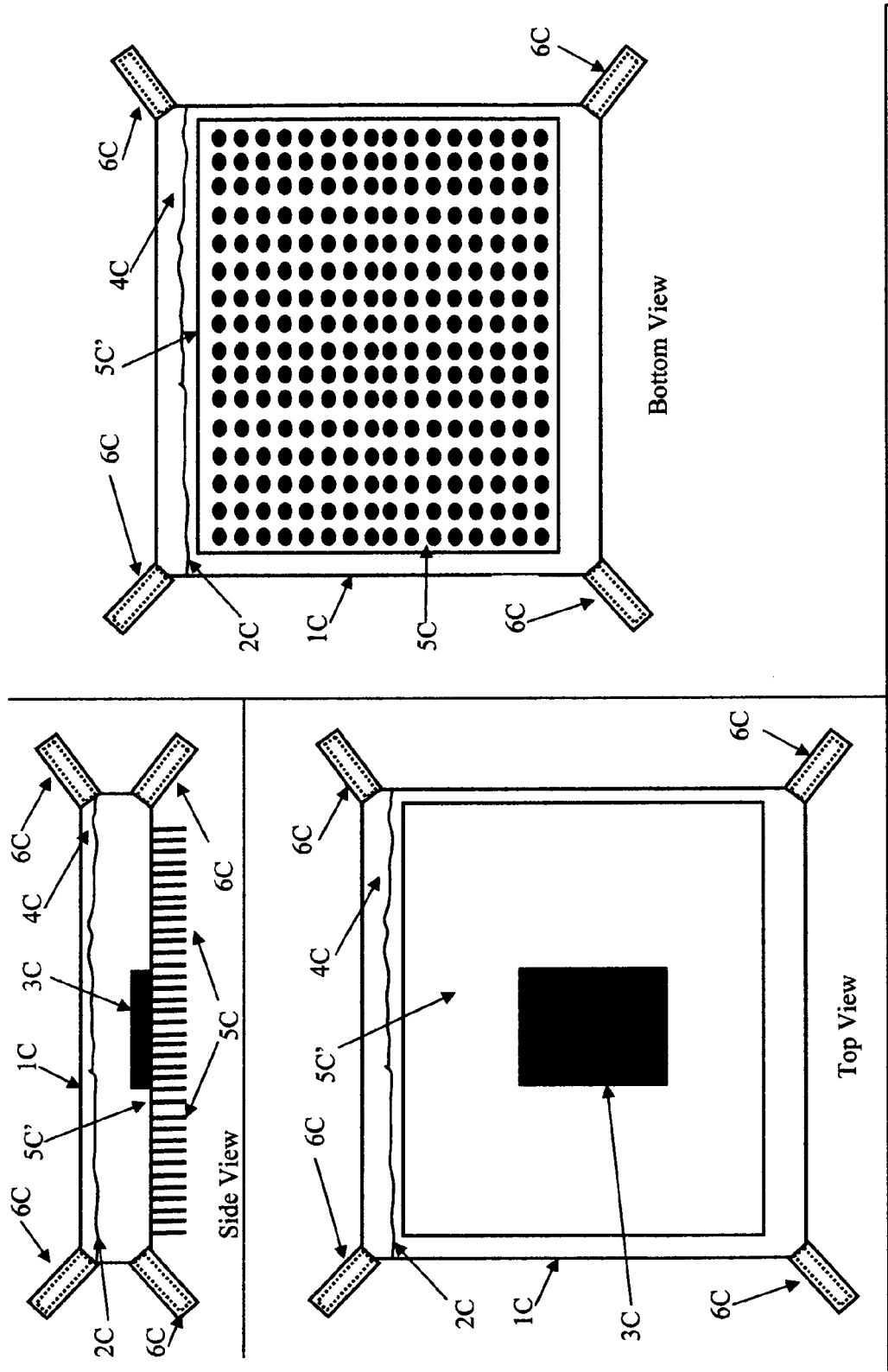
Figure 3: Another Electronic Assembly Packaged in a Case that is Designed to Operate as a Liquid Phase to Gas Phase Heat Pipe, in any orientation

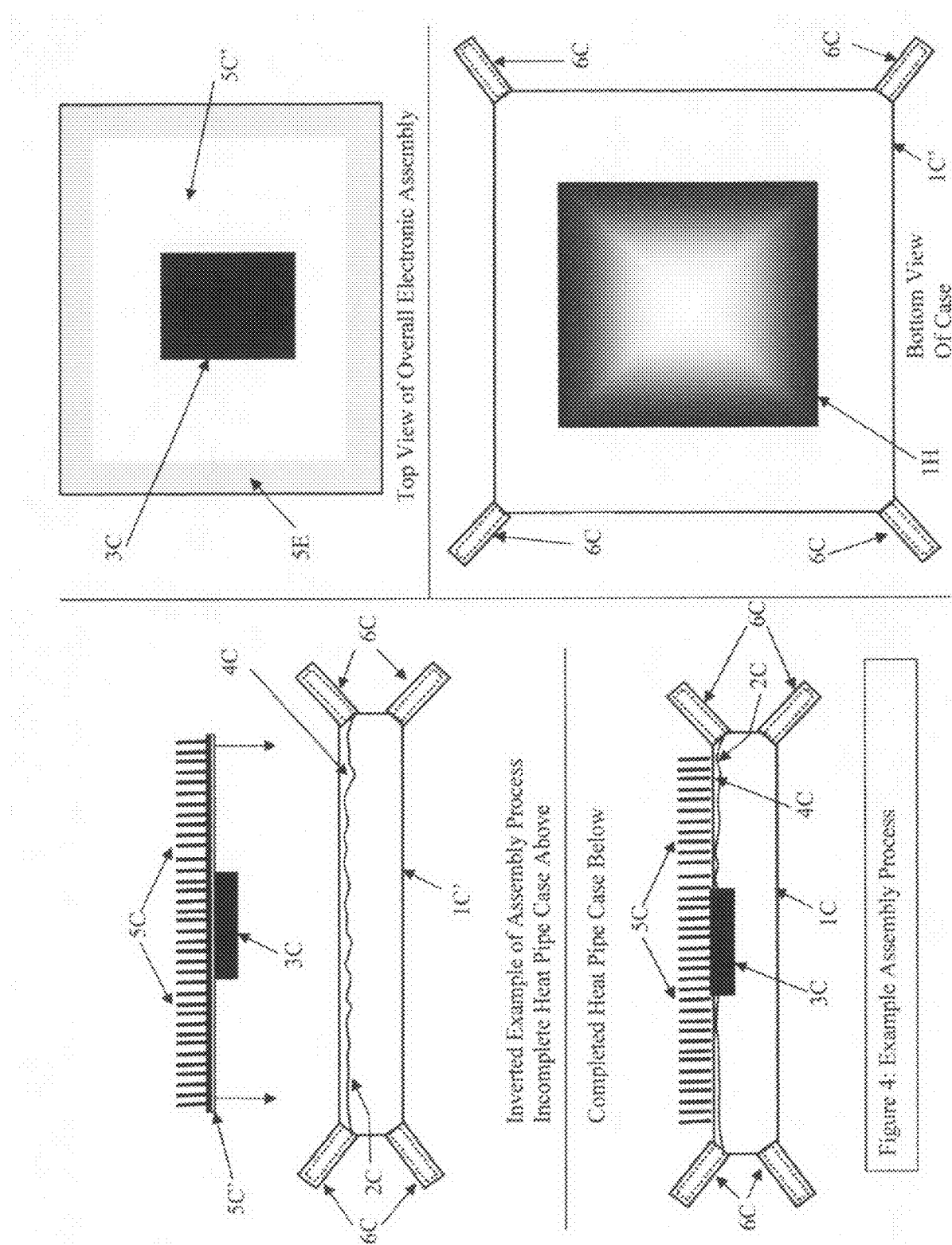
Figure 4: Example Assembly Process

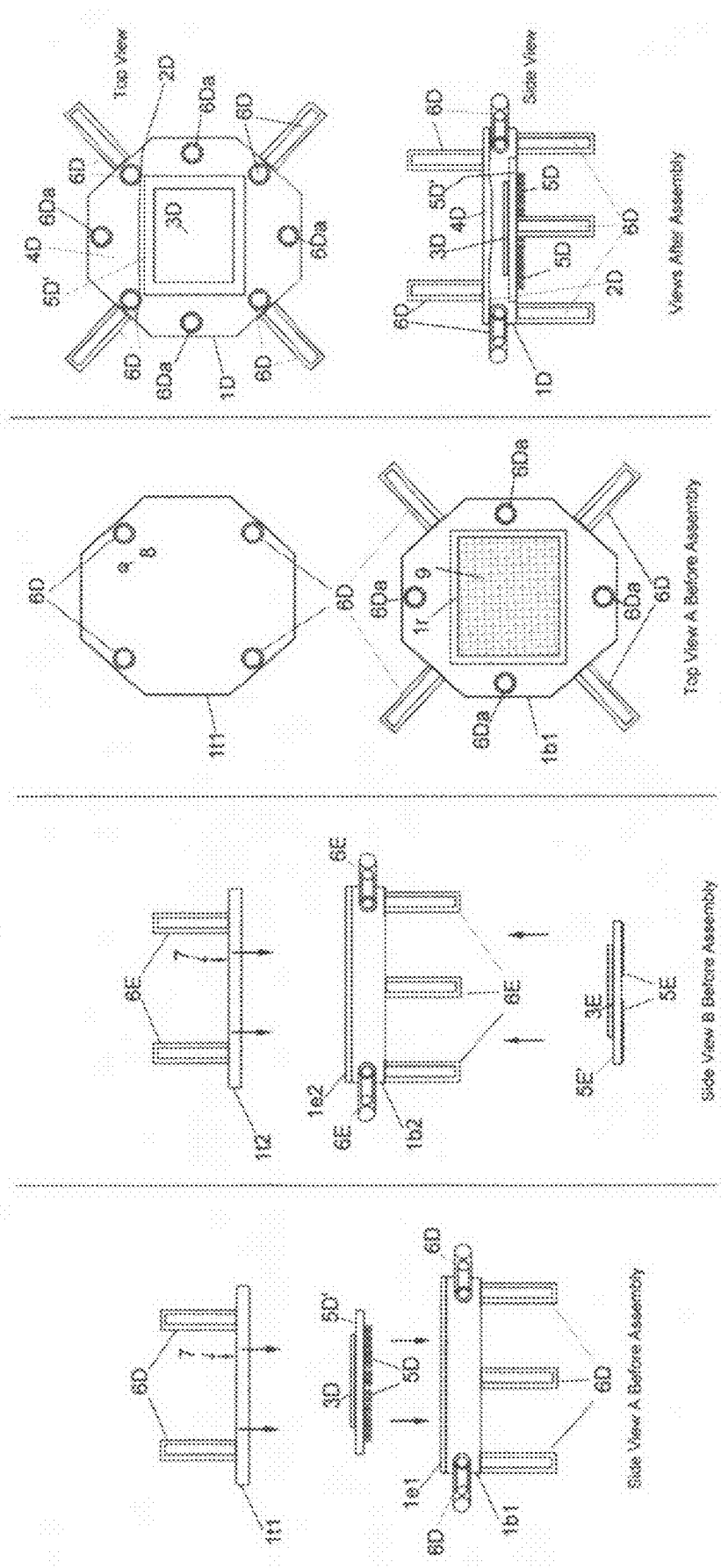

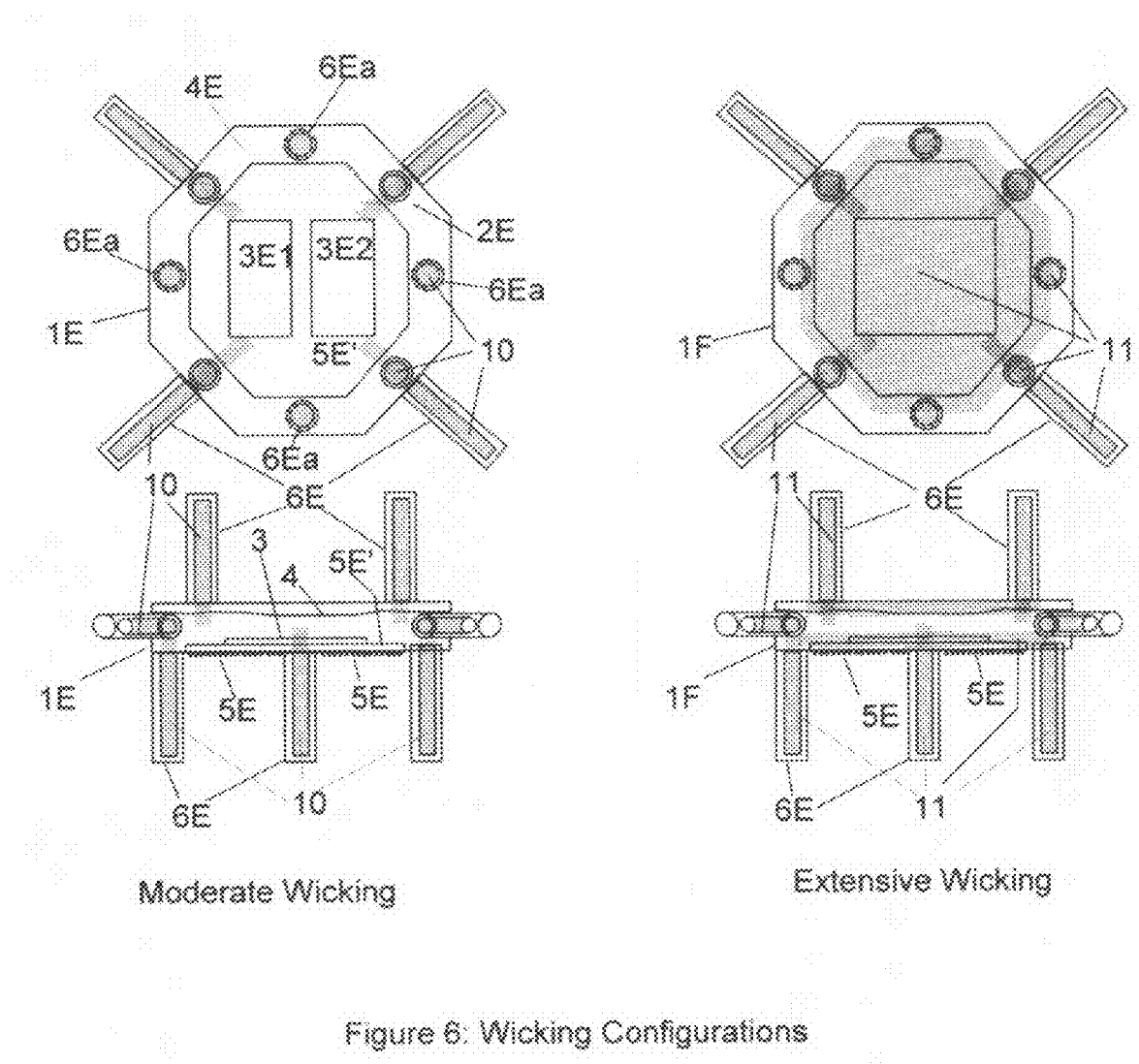
Figure 6: Wicking Configurations

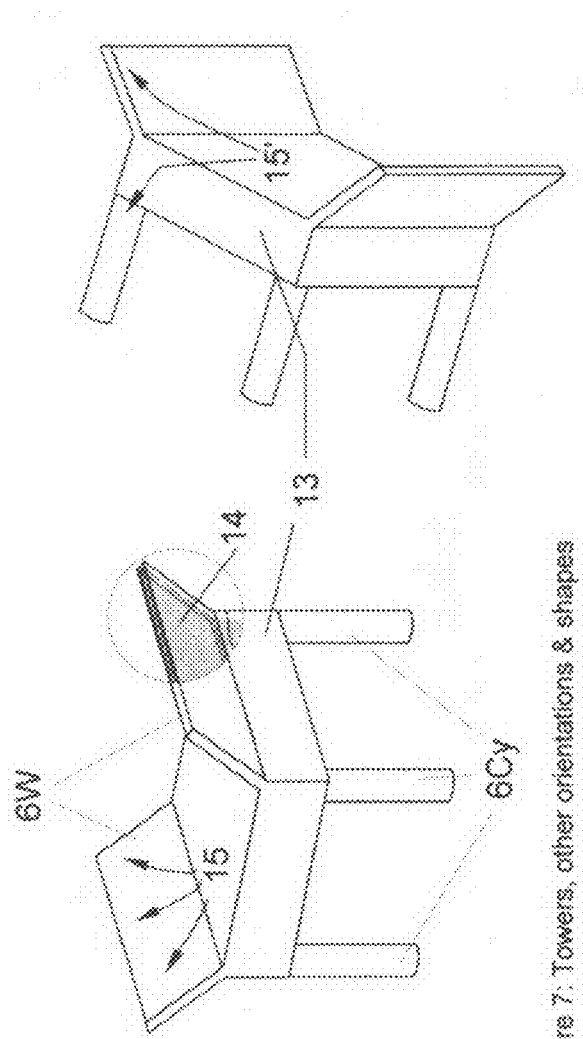
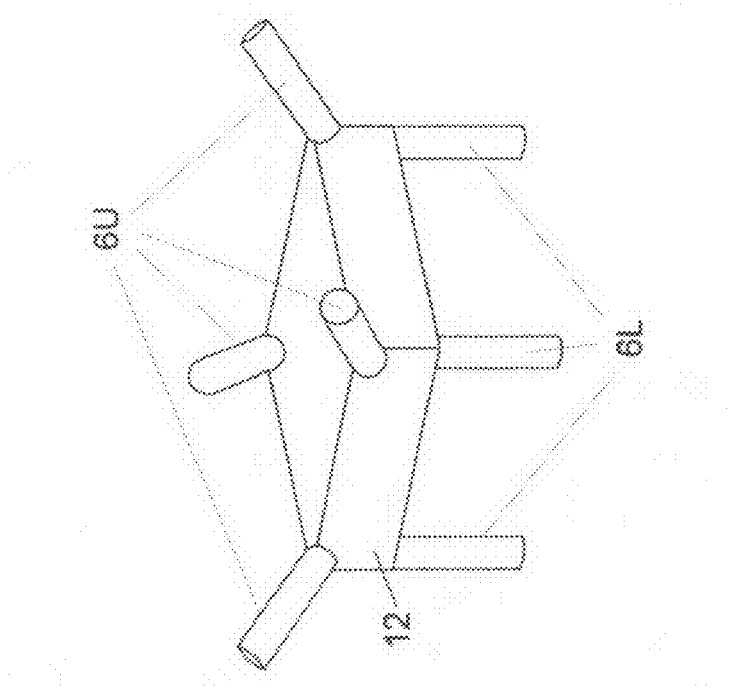
Figure 7: Towers, other orientations & shapes

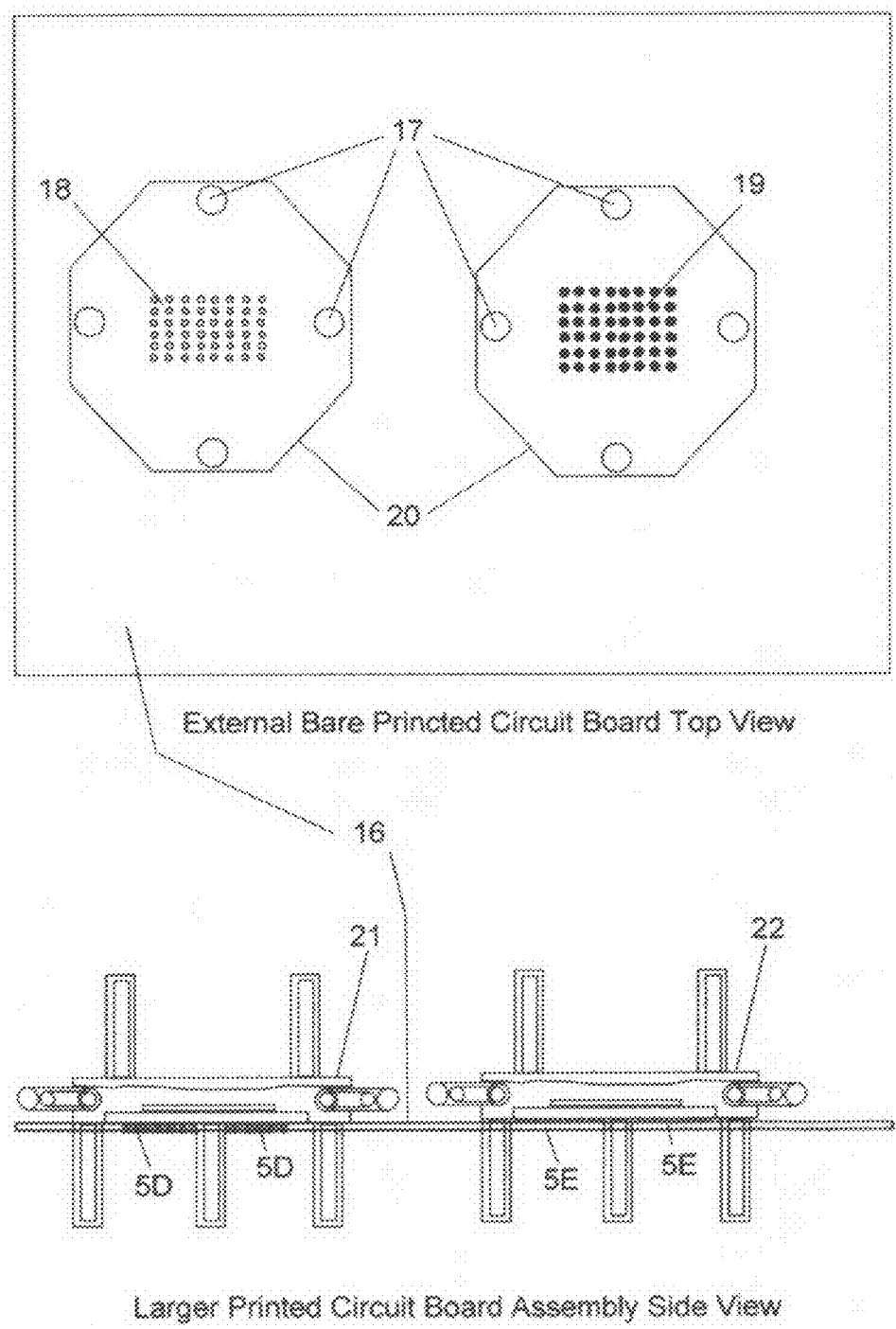
Figure 8: Electronics contained within a Heat Pipe Case assembled into a larger Electronic Assembly; Pins versus Pads

ELECTRONIC PACKAGE WHEREBY AN ELECTRONIC ASSEMBLY IS PACKAGED WITHIN AN ENCLOSURE THAT IS DESIGNED TO ACT AS A HEAT PIPE

CROSS REFERENCE TO RELATED APPLICATIONS

Application No. 60/686,289 Filing Date: Jun. 1, 2005 Confirmation # 7771, is a Provisional Patent application for which this application is a non-provisional Utility patent follow up by the same inventor, Robert J. Rapp customer #41400.

FEDERAL RESEARCH STATEMENT

Not Applicable, this invention was developed without government assistance.

JOINT RESEARCH STATEMENT

Not Applicable, this invention was developed by inventor only.

INCORPORATION BY REFERENCE

Not Applicable.

SEQUENCE LISTING

Not Applicable.

BACKGROUND OF THE INVENTION

1. Field of the Invention

Heat pipes have been used to cool electronics for some time, yet heat pipes that use heat to evaporate a liquid into a gas are not contained within the same physical case such that the liquid that performs the cooling function is in direct contact with conducive surfaces of an electronic component or electronic assembly contained within said enclosure or case. Typically heat pipes are added to electronic devices after they have been manufactured into a component or electronic sub-assembly and are not designed into the components case from the very beginning.

Evaporative heat pipes are available for purchase as separate devices that can be added to electronic assemblies to cool them, yet these devices do not encase or enclose the electronic components that they cool. These types of heat pipes typically use materials are not well suited to enclosing electronic components with exposed conductive surfaces as they use materials that give up ions easily, as they use materials such as copper and water. If these materials were used to encase and cool electronics with exposed metallic interconnects the electronics would be contaminated by ions that would short and/or corrode metallic contacts contained within. Furthermore since in these designs the liquid is not in direct contact with the electronic components themselves, a fact that limits their performance as heat must first transfer through the components case before they reach heat pipes of this sort.

Other forms of liquid cooling are not small and self contained, as they rely on circulating a liquid with a pump, or condensing a liquid by compressing a gas.

Since electronic device densities are increasing rapidly and operating at ever higher frequencies a new method for cooling electronics that can be contained within a small package would enable higher power electronics to be packaged in highly portable electronic devices that operate in configurations of high heat density. Such high heat transfer capabilities are intended to enable electronic devices to operate within current component form factors while minimizing or eliminating the need for external heat transfer mechanisms that are usually required to cool electronic components that are typically attached to conventional high heat power electronic devices.

2. Description of Related Art

U.S. Pat. No. 4,833,567 by Saaski et al. describes a case designed to operate as a heat pipe that encloses the electronic component or assembly heat pipe case built around an electronic assembly that includes electronic components, and a printed circuit substrate. Saaski's invention uses a plurality of "flutes" that are distributed along the top inner portion of his heat pipe assembly. Unlike the invention described within this disclosure Saaski's flutes are very short and are fully contained within the body of his heat pipe case. Saaski's invention does not use or describe or show a plurality of towers that extend in a plurality of directions where each tower contains at least one chamber as is described in this disclosure. The use of such a plurality of towers that extend in a plurality of directions provides true 3 dimensional heat pipe function, Saaski's invention is not designed to operate optimally when inverted. Thus the invention described within this disclosure is an improvement over Saaski's invention.

DESCRIPTION OF THE INVENTION

Brief Summary of the Invention

Higher power devices generate vast amount of heat require rapid heat transfer capabilities to keep them functioning optimally. Evaporating liquids carry a large amount of heat energy away from a point of evaporation; this type of cooling mechanism is known as a liquid phase to gas vapor phase heat pipe. The invention describe within is a case or enclosure that surrounds an electronic component, sub-assembly, or assembly that is deigned to operate as a liquid phase to gas vapor phase heat pipe; where the case of the electronic assembly itself is designed to perform the function said liquid phase to gas vapor phase heat pipe. Here electronic components are in direct contact with a liquid, heat from the electronic components evaporates the liquid forming a gas vapor, and the vapor raises carrying heat energy to the case where this heat energy is conducted into the surrounding environment. Once the gas vapor dissipates thermal energy into the case, it condenses back into a liquid where it rains down or is wicked back down onto the electronic components. The case itself may contain a plurality of chambers where the gas vapors can rise into. A plurality of chambers would operate like a group of cooling towers, increasing the surface area in configurations where heat can be transferred more efficiently: from the gas vapor through the chamber walls and into the external environment.

Towers with chambers contained within are referred to as chambers/towers in this disclosure. A plurality of chambers/towers built into this invention extend in a plurality of directions providing 3 Dimensional heat pipe functionality. This is because as the enclosure is rotated in any orientation, one or more of these chambers/towers will be above liquid level while the liquid will always be in contact with some portion of the electronic component, sub-assembly, or assembly. The plurality of chambers/towers thus provide a place for the gas will flow up into the chambers that are above liquid level even if the enclosure is inverted.

Furthermore the liquid and the case would be made of materials that will not contaminate the encased electronic assembly with ions. This is an important non-obvious benefit of the design. Furthermore the case is designed to operate as a heat pipe that encloses the electronic component or assembly is small, self contained, and is designed to perform its function in any orientation. If the electronic component, sub-assembly, or assembly is inverted or turned in any physical orientation the electronics contained within will remain in contact with the liquid such that the electronic circuits are optimally cooled. The case is designed such that the gas vapor can carry the maximum amount of thermal energy to the external environment through the case given any physical orientation of the case. Furthermore the overall package may be designed such that an electronic component packaged within will fit within the same form factor as a similar component designed with conventional means, yet provide superior cooling to electronic component packaged within.

The use of towers that contain chambers (chambers/towers) in this invention is an improvement over prior art: Prior art heat pipes of this sort (such as U.S. Pat. No. 4,833,567 by Saaski et al.) rely on a rectangular case with very short flutes that operate optimally only in one orientation, rotate or invert them and their heat pipe function will reduce or cease.

The chambers/towers extending in a plurality of directions provide two benefits over prior art:
1. They provide a significant increase in surface area for heat dissipation while increasing the volume of the case by a small amount.
2. They provide 3 dimensional heat pipe functionality; no matter what direction the case is rotated some of the towers will always be above liquid level.

Another non-obvious benefit of this design is that such an electronic component, sub-assembly, or assembly could be soldered in place onto a circuit board in an oven, even if the electronic components inside were originally soldered with similar materials & temperatures. In this case the electronic assembly contained within the heat pipe would be protected from the external heat of the oven. The solder holding electronic components in place on the inside of the heat pipe would be cooled by the fluid contained within the heat pipe long enough for the component to be soldered to an external circuit.

BRIEF DESCRIPTION OF THE SEVERAL VIEWS OF THE DRAWINGS

FIG. 1 shows an electronic assembly 5A' whereby a case/enclosure 1A contains a conventional electronic assembly/sub-assembly 3A, a liquid 2A, and a gas vapor 4A that forms a liquid phase to gas phase heat pipe. The case/enclosure in FIG. 1 does not have any chambers/towers, it's a tower-less case that is similar to prior art. Also shown are pads 5A by which the overall electronic assembly may be soldered to a printed circuit board by standard assembly processes. A Side View, Top View, and Bottom View are shown; all views show liquid 2A, gas vapor 4A, and the case/enclosure 1A: for simplicity and clarity, these views are semi-cross sectional views: the Top View top view shows the conventional electronic assembly/sub-assembly 3A, yet for clarity does no show pads 5A; item 5A' in is a conventional electronic assembly that includes the electronic assembly/sub-assembly 3A and pads 5A: again for clarity, the Bottom view shows pads 5A yet does not show the electronic assembly/sub-assembly 3A.

FIG. 2 shows an electronic assembly 5B' whereby a case/enclosure 1B contains a conventional electronic assembly/sub-assembly 3B, a liquid 2B, and a gas vapor 4B that forms a liquid phase to gas phase heat pipe. Also shown are pads 5B by which the overall electronic assembly may be soldered to a printed circuit board by standard assembly processes. Furthermore contains a plurality of chambers/towers 6 that are designed to optimize the cooling of the electronic assembly contained within in any physical orientation. The dashed lines of the chambers/towers 6 are chambers contained within the towers, the solid lines of the chambers/towers 6 are the towers that contain the chambers. A Side View, Top View, and Bottom View are shown; all views show liquid 2B, gas vapor 4B, and the case/enclosure 1B: for simplicity and clarity, these views are semi-cross sectional views: the Top View top view shows the conventional electronic assembly/sub-assembly 3B, yet for clarity does no show pads 5B; item 5B' in is a conventional electronic assembly that includes the electronic assembly/sub-assembly 3B and pads 5B: again for clarity, the Bottom view shows pads 5B yet does not show the electronic assembly/sub-assembly 3B. In this figure the electronic assembly/sub-assembly 3B is a conventional wire bonded electronic assembly 5B', wire bonds are shown as item 3B'. Also shown in FIG. 2 are Cylindrical Chambers/Towers Cross-Sectional Views; cylindrical chambers/towers are shown, a Side View item 6S and a Top View item 6T are shown; in these views chambers are shown with dotted lines and the towers are shown with a solid line; Note that a chamber contained within a tower.

FIG. 3 shows an electronic assembly 5C' whereby a case/enclosure 1C contains a conventional electronic assembly/sub-assembly 3C, a liquid 2C, and a gas vapor 4C that forms a liquid phase to gas phase heat pipe. Also shown are pins 5C by which the overall electronic assembly may be soldered to a printed circuit board by standard assembly processes. Furthermore contains a plurality of chambers/towers 6C that are designed to optimize the cooling of the electronic assembly contained within in any physical orientation. The dashed lines of the chambers/towers 6C are chambers contained within the towers, the solid lines of the chambers/towers 6C are the towers that contain the chambers. A Side View, Top View, and Bottom View are shown; all views show liquid 2C, gas vapor 4C, and the case/enclosure 1C: for simplicity and clarity, these views are semi-cross sectional views: the Top View top view shows the conventional electronic assembly/sub-assembly 3C, yet for clarity does no show pads 5C; item 5C' is a conventional electronic assembly that includes electronic assembly/sub-assembly 3C and pads 5C: the Bottom view shows pads 5C yet does not show the electronic assembly/sub-assembly 3C.

FIG. 4, "Example of the Assembly Process" shows on one possible assembly process, an "Inverted Example of the Assembly Process" is shown; this is same the assembly as shown in FIG. 3; an overall electronic assembly item 5C' that includes an electronic assembly/sub-assembly item 3C and pins items 5C are depicted; a case 1C' that includes chambers/towers 6C, predominantly filled with a liquid 2C, and some gas 4C are depicted during assembly; in this example an overall electronic assembly 5C' is assembled to an incomplete case 1C' forming a completed heat pipe case 1C with an embedded electronic assembly 5C'; see the "Completed Heat Pipe Case" 1C in FIG. 4. Also shown in FIG. 4 are a "Top View of the Overall Electronic Assembly" where an overall electronic assembly 5C' that includes an electronic assembly/sub-assembly 3C and an epoxy dispersed in the gray area 5E are connected to the bottom of the case. In the "Bottom View of Case" an unassembled case 1C' is shown, the case includes chambers/towers 6C, and a hole in the case 1H: The hole in the case 1H and epoxy dispersed in area 5E are used to bond the overall electronic assembly to the case.

FIG. 5 shows improvement in assembling the invention not described in the original disclosure and are new matter related to the Continuation in Part portion of this disclosure. FIG. 5 depicts "Side View A Before Assembly", "Side View B Before Assembly", "Top View A Before Assembly", and "Views After Assembly". Each one of these figures contains an overall electronic assembly, an enclosure with a plurality of chambers/towers wherein some liquid and some gas will be contained after assembly.

"Side View A Before Assembly" shows the top piece of the enclosure 1t1 that includes chambers/tower 6D, the bottom piece of the enclosure 1b1 that includes chambers/towers 6D, an electronic assembly/sub-assembly 3D, an overall electronic assembly 5D', pins 5D, a plug 7; Arrows show how the overall electronic assembly 5D' is aligned to the bottom of the enclosure 1b1, how the top of the enclosure 1t1 is aligned to the bottom of the enclosure 1b1, and how the plug 7 is aligned with the top of the enclosure. In this example the top of the enclosure 1t1 fits over an edge 1e1 in the bottom of the case 1b1, the top and bottom of the case are physically bonded together using epoxy, ultra-sonic welding, or other commercially available process; the enclosure pieces fit like a top of a coffee can fitting over the edge of a coffee can.

"Side View B Before Assembly" is very similar to Side View A Before Assembly except a different overall electronic assembly is depicted, in this instance the overall electronic assembly is attached to the bottom of the case from below: Side View B Before Assembly shows the top piece of the enclosure 1t2 that includes chambers/tower 6E, the bottom piece of the enclosure 1b2 that includes chambers/towers, an electronic assembly/sub-assembly 3E, an overall electronic assembly 5E', pads 5E, a plug 7; Arrows show how the overall electronic assembly 5E' is aligned to the bottom of the enclosure 1b2, how the top of the enclosure 1t2 is aligned to the bottom of the enclosure 1b2, and how the plug 7 is aligned with the top of the enclosure. In this example the top of the enclosure 1t2 also fits over an edge 1e2 in the bottom of the case tbt1, the top and bottom of the case are physically bonded together with epoxy; the enclosure pieces also fit like a top of a coffee can fitting over the edge of a coffee can.

"Top View A Before Assembly" is the same assembly shown in "Side View A Before Assembly", please refer to both depictions; this top view shows elements of the enclosure that improve assembly. Top View A Before Assembly shows: the top part of the enclosure 1t1 that includes chambers/towers 6D, a hole in the enclosure 8, the bottom part of the enclosure 1b1 that includes chambers/towers 6D & 6Da, a recession in the enclosure 1r, and a hole in the enclosure 9. Chambers/towers 6Da are located on the bottom side of the case, they are shown in cross-section. Please note that the recession 1r is shaped to fit the overall electronic assembly 5D', a thermally conductive epoxy placed into this recession is used to bond the overall electronic assembly to the bottom of the enclosure 1t1; pins from the overall electronic assembly fit through hole 9.

"Views After Assembly" in FIG. 5 show the completed assembly in a top view and a side view; an electronic assembly/sub-assembly 3D is assembled onto an overall electronic assembly 5D' and built within enclosure 1D that is designed to operate as a liquid phase to gas phase heat pipe, the enclosure 1D contains a partially liquid 2D partially gaseous 4D environment; Chambers/towers 6D and pins 5D are also depicted.

FIG. 6 shows wicks 10 & 11 incorporated into the invention; in this instance the overall electronic assembly 5E' incorporates two electronic assemblies/sub-assemblies 3E1, & 3E2. The enclosures 1E & 1F include chambers/towers 6E & 6Ea, pads 5E, some portion of liquid 2E, some portion of gas 4E. The two electronic assemblies/sub-assemblies 3E1, & 3E2 are visible in the depiction of "Moderate Wicking" shown in FIG. 5. The depictions of "Moderate Wicking" and "Extensive Wicking" contain identical overall electronic assemblies; the depictions are differentiated by the amount of wicking incorporated into the enclosure: in the instance of "Moderate Wicking", wicks 10 fill chambers/towers 6E and extend into the center of the enclosure 1E, yet do not fill the enclosure; in the instance of "Extensive Wicking" wicks 11 fill the chambers/towers 6E and predominantly fill the enclosure 1F. Wicks are commonly used in heat pipes and are an obvious extension of the invention.

FIG. 7 shows "Chambers/Towers, other orientations & shapes" that are consistent with the invention:

Item 12 is an enclosure where the upper chambers/towers 6U extend in various directions, and lower chambers/towers 6L extend in a direction that is perpendicular to the enclosure.

Item 13 is an enclosure with rectangular wedge shaped chambers/towers 6W; also shown, in cross section is a portion of wedge shaped chamber 14 that extends throughout the tower. Item 15 shows that the gas rises up throughout such a wedge shaped chamber. Even when this enclosure, item 13 is turned on its side, gas 15' can rise into chambers within a portion of the wedge shaped tower and into chambers within the cylindrical towers that are above the liquid level.

FIG. 8: Shows how two different heat pipe case assemblies (Items 21, & 22) that are consistent with this invention soldered to a printed circuit board, Item 16.

A top view of the bare circuit board, Item 16 is shown as "External Bare Printed Circuit Board Top View"; this view shows the top of a printed circuit board before electronic components have been installed. Item 17 are holes in this printed circuit board though which towers from the heat pipe case pass through during assembly of a larger electronic assembly. A side view of the printed circuit board, Item 16, is shown in "Larger Printed Circuit Board Assembly Side View"; here two different heat pipe case assemblies, Items 21, & 22 have been assembled into larger electronic assembly.

Pins 5D on assembly 21 may be soldered to holes 18, and pads 5E may be soldered to pads 19; items 18 & 19 form electrical interconnects between the printed circuit board 16 and assemblies 21 & 22: Item 18 are standard through holes used in conventional printed circuit boards; Item 19 are pads on the surface of the printed circuit board, Item 16. Item 20 are silk-screened images that are used when aligning & installing the heat pipe cases 21, & 22 onto the printed circuit board, item 16.

Pins, Item 5D in one of the heat pipe case assemblies, Item 21, fit through holes, Item 18, in the printed circuit board, Item 16. Pads, Item 5E in the heat pipe case assembly, item 22, align and with Pads, Item 19 on the surface of the printed circuit board, Item 16. In either instance these pins and pads may be soldered to a larger printed circuit board assembly through conventional soldering techniques.

DETAILED DESCRIPTION OF THE INVENTION

The invention describe within is a case or enclosure that surrounds an electronic component, sub-assembly, or assembly that is deigned to operate as a liquid phase to gas vapor phase heat pipe; where the case of the electronic assembly itself is designed to perform the function said liquid phase to gas vapor phase heat pipe. Here electronic components are in direct contact with a liquid, heat from the electronic components evaporates the liquid forming a gas vapor, and the vapor raises carrying heat energy to the case where this heat energy is conducted into the surrounding environment. Once the gas vapor dissipates thermal energy into the case, it condenses back into a liquid where it rains down or is wicked back down onto the electronic components. The case itself may contain a plurality of chambers where the gas vapors can rise into. A plurality of chambers would operate like a group of cooling towers, increasing the surface area in configurations where heat can be transferred more efficiently: from the gas vapor through the chamber walls and into the external environment.

Towers with chambers contained within are referred to as chambers/towers in this disclosure. A plurality of chambers/towers built into this invention extend in a plurality of directions providing 3 Dimensional heat pipe functionality. This is because as the enclosure is rotated in any orientation, one or more of these chambers/towers will be above liquid level while the liquid will always be in contact with some portion of the electronic component, sub-assembly, or assembly. The plurality of chambers/towers thus provide a place for the gas will flow up into the chambers that are above liquid level even if the enclosure is inverted.

Furthermore the liquid and the case would be made of materials that will not contaminate the encased electronic assembly with ions. This is an important non-obvious benefit of the design. Furthermore the case is designed to operate as a heat pipe that encloses the electronic component or assembly is small, self contained, and is designed to perform its function in any orientation. If the electronic component, sub-assembly, or assembly is inverted or turned in any physical orientation the electronics contained within will remain in contact with the liquid such that the electronic circuits are optimally cooled. The case is designed such that the gas vapor can carry the maximum amount of thermal energy to the external environment through the case given any physical orientation of the case. Furthermore the overall package may be designed such that an electronic component packaged within will fit within the same form factor as a similar component designed with conventional means, yet provide superior cooling to electronic component packaged within.

The use of towers that contain chambers (chambers/towers) in this invention is an improvement over prior art: Prior art heat pipes of this sort (such as U.S. Pat. No. 4,833,567 by Saaski et al.) rely on a rectangular case with very short flutes that operate optimally only in one orientation, rotate or invert them and their heat pipe function will reduce or cease.

The chambers/towers extending in a plurality of directions provide two benefits over prior art:
3. They provide a significant increase in surface area for heat dissipation while increasing the volume of the case by a small amount.
4. They provide 3 dimensional heat pipe functionality; no matter what direction the case is rotated some of the towers will always be above liquid level.

In the instance where cylindrical towers and cylindrical chambers are used the surface area of the case is increased while the volume of the case is increased to a smaller extent as shown in the following example:

Consider a single cylindrical tower 2 inches high (h) with an internal Radius® of 0.1 inches; the surface area (S) that such a tower provides for heat transfer is described by the equation:

$$S=2pirh+pir^2=2pi(0.1)(2)+pi(0.1)^2=1.257+0.0314=1.2884 \text{ square inches.}$$

The volume of such a tower (V) follows the equation: $V=pi\ r^2\ h=pi(0.1)^2(2)=0.06283$ cubic inches In the instance where four towers are above the liquid level, the towers would provide a total surface area ($S_T$) of 5.1536 square inches for the gas to transfer heat to; the volume contained by 4 of these towers is 0.2513 cubic inches.

A heat case designed to operate as a heat pipe that encloses the electronic component or assembly where gas can contact surfaces that measure 2 inches wide, 2 inches deep, and 0.25 inches high (a tower-less heat pipe case) would provide a surface area S', where:

$S'=(2)(2)+(4)(2)(0.25)=4+2=6$ square inches; where this entire 6 square inches of surface area is located very close to the electronic components, the heat source.

If however the case with surface area S' (the tower-less case example above) were built with towers (as described in the instance above with 4 towers above the liquid level) the entire surface area ($S_E$) for gas heat transfer would be $S_E=S'+S_T=6$ square inches+5.1536 square inches=11.1536 square inches. The towers themselves nearly double the surface area where gas can transfer thermal energy to, where the surface area of the towers extends far above and away from the hot electronic components.

Thus the use of chambers/towers that extend in a plurality of directions describe a structure that is different from and not anticipated by prior art; This invention is an improvement over prior art in the field of heat pipes that contain electronic assemblies.

This invention includes:

an enclosure that contains an electronic assembly, some portion of liquid that is designed to operate as a heat pipe for cooling electronics contained within, some portion of gas (such that said enclosure operates as a liquid phase to a vapor phase heat pipe where the liquid evaporates into a gas vapor into a gas vapor transfers heat and condenses back into a liquid), towers that extend in a plurality of directions, where each tower contains at least one chamber.

Another non-obvious benefit of this design is that such an electronic component, sub-assembly, or assembly could be soldered in place onto a circuit board in an oven, even if the electronic components inside were originally soldered with similar materials & temperatures. In this case the electronic assembly contained within the heat pipe would be protected from the external heat of the oven. The solder holding electronic components in place on the inside of the heat pipe would be cooled by the fluid contained within the heat pipe long enough for the component to be soldered to an external circuit.

Please also note the electronic assembly built into the heat pipe case may be soldered to a printed circuit board by using pins, pads, or other equivalent structures including but not limited to solder balls.

MAKING THE INVENTION

The invention is made using conventional commercially available processes, the chambers/towers built into the enclosure is an improvement over prior art heat pipe cases: The invention relies on the use of chambers/towers to provide improved heat pipe function as compared to prior art by increasing the surface area available for heat transfer significantly while increasing the internal volume of the enclosure by a small amount.

In this invention a conventional electronic component or assembly is assembled within a case that is designed to operate as a liquid phase to gas phase heat pipe where said electronic component or assembly is introduced into a partially liquid partially gaseous environment. The invention does not relate to an individual assembly process, and is not a product by process.

The invention includes: an electronic assembly/sub-assembly built into an enclosure, where pads, pins, or equivalent thereof are dispersed along a surface of the overall electronic assembly.

The electronic assembly/sub-assembly is typically a commercially available integrated circuit or electronic component built with pins, pads, or equivalent dispersed along its bottom surface. The invention incorporates such a conventional electronic assembly/sub-assembly with pins, pads, or equivalent dispersed along a surface; the invention is not related to the precise manufacturing process of the electronic assembly/sub-assembly. Numerous types of electronic assemblies/sub-assemblies with pins or pads dispersed along a surface are available in the marketplace.

The case/enclosure is manufactured by commercially available processes, the invention is not related to the precise manufacturing process yet the chambers/towers built into the case are a feature that distinguishes this invention from prior art. As depicted in the drawings, the case will be designed to receive an electronic assembly/sub-assembly where at least one surface of the electronic assembly/sub-assembly is contained within the case where it is in contact with a cooling liquid and another surface of the electronic assembly/sub-assembly includes pins, pads, or equivalent are dispersed on a portion of outside surface of the case.

One simple assembly process is depicted in FIG. 4, it involves attaching a purchased or pre-fabricated electronic assembly/sub-assembly to a pre-fabricated case. The case has a hole through which a portion of the electronic assembly/sub-assembly fits. The case is inverted and predominantly filled with a liquid; the electronic assembly/sub-assembly has epoxy distributed along a portion of its surface. The electronic assembly/sub-assembly is aligned and attached to the case and the epoxy makes a water tight seal bonding the electronic assembly/sub-assembly to the case.

A heat pipe case built consistent with this invention may be soldered to a conventional printed circuit board, see FIG. 8.

New matter introduced into the continuation in part portion of this invention relates to various possible case/enclosure fabrication processes, assembly features, and a depiction of wicks that were not explicitly reviewed in the original disclosure yet may be incorporated into the invention. This new matter does not alter the basic operating principal of the invention, it merely describes various ways in which the invention may be fabricated in greater detail and includes features that enhance the assembly process; this new matter are considered to be obvious enhancements to the invention. This new matter follows below, and is depicted in FIGS. 5, 6, and 7.

The case may be made by a variety of different processes and is made from heat conductive materials, typically of metals with a low potential for generating free ions, graphite, or other commercially available heat conducting material. The case will initially be built in two or more pieces. Since the invention does not relate to the method of how the case is fabricated, the pieces of the case may be made by various processes including, yet not limited to the ones described below:

An elegant method for fabricating pieces of the case is by injection molding of a thermally conductive material. In this instance, a "top portion" and a "bottom portion" of the case are injection molded, where each portion includes a plurality of towers, where each tower would also contains at least one chamber.

A second possible method for making the case parts is machining them out of solid stock; milling and drilling the parts using modern computer controlled machines.

A third possible method for making the case parts is through a series of commercially available processes including but not limited to drilling, cutting, or stamping. Parts of the case may be attached using thermally conductive epoxy or ultra sonic welding.

A conventional electronic assembly/sub-assembly that contains one or more electronic components may be purchased commercially or manufactured. One form of electronic assembly/sub-assembly include microprocessors.

The electronic assembly will fit into a hole in the "bottom portion" of the case and be attached using a thermally conductive adhesive. The substrate or printed circuit portion of the electronic assembly is aligned with a hole in the "bottom portion" of the case that is sized to receive the edge of the substrate or printed circuit. Thermally conductive adhesive is used to bond and the electronic assembly to the "bottom portion" of the case and to seal any void between the edge of the edge of the electronic assembly and the hole in the bottom portion of the case. In one instance the edge of the electronic assembly fits into a small recession 1*r* (see FIG. 5) after an epoxy has been applied within the recession, the electronic assembly is aligned and bonded onto the case such that the pins, pads, or equivalent structures on the bottom side of the electronic assembly protrude from the bottom portion of the case.

As shown in FIG. 5, the "bottom portion" of the case contains chambers/towers 6D, & 6E; each tower contains at least one chamber where gas can rise into or liquid can flow into. Once the electronic assembly is attached to the "bottom portion" of the case, the towers may have a wick inserted in them. The "top portion" of the case could also have wicks installed in its towers. Wicks 10, & 11 are depicted in FIG. 6.

At this point the "top portion" (1*t*1, or 1*t*2 in FIG. 5) would be aligned and attached to the bottom portion (1*b*1, 1*b*2 in FIG. 5) of the case (the pieces being attached using a thermally conductive adhesive, by an ultra-sonic welding process, or other conventional process.

Once the electronic assembly is built within the case, the case is predominantly filled with the cooling liquid 2D through an access hole 8 located somewhere in the case, possibly in a tower. The access hole will then be sealed with a plug 7. This filling/sealing process may be performed in a controlled environment where the cooling fluid is present in liquid and gas forms without the presence of other gasses.

The invention claimed is:

1. A heat pipe assembly comprising: a case/enclosure; said case/enclosure is an evaporation chamber of the heat pipe assembly; said case/enclosure having a plurality of chambers/towers extending from said case/enclosure in a plurality of directions; and at least one electronic component or electronic assembly/sub-assembly; wherein at least a portion of one surface of said electronic component or electronic assembly/sub-assembly is in direct contact with a liquid contained within the case/enclosure; wherein a portion of said electronic component or electronic assembly/sub-assembly is provided with a plurality of pins or pads across a portion of an exterior surface of the case/enclosure; wherein at least one of said chambers/towers is/are above liquid level and at least one other chambers/towers is/are below liquid level for any given orientation of said heat pipe assembly in three dimensional space; said plurality of chambers/towers are in fluid communication with an internal volumetric space of said case/enclosure and function as condensing chambers.

2. The head pipe assembly of claim 1, wherein said chamber/towers are cylindrical in shape.

3. The heat pipe assembly of claim 1, wherein said chambers/towers have shares other than cylindrical.

4. The heat pipe assembly of claim 1 further comprising wicks contained within said case/enclosure; wherein said wicks extend form the inside of each of said chambers/towers and contained within said case/enclosure; said wicks in fluid communication between said towers and a space within said case/enclosure where said electronic component or electronic assembly/sub-assembly reside.

* * * * *